(12) United States Patent
Kang et al.

(10) Patent No.: US 7,442,622 B2
(45) Date of Patent: Oct. 28, 2008

(54) SILICON DIRECT BONDING METHOD

(76) Inventors: Sung-gyu Kang, 306-1602 Sunkyung 3-danji Apt., Ingye-dong, Paldai-gu, Suwon-si, Gyeonggi-do (KR); Seung-mo Lim, 101-405 Kukdong Apt., Mangpo-dong, Yeongtong-gu, Suwon-si, Gyeonggi-do (KR); Jae-chang Lee, 104-801 Daechang Apt., Byeongjeom-dong, Hwaseong-si, Gyeonggi-do (KR); Woon-bae Kim, 234-1101 Hwanggol Maeul Poonglim Apt., Yeongtong-dong Yeongtong-gu, Suwon-si, Gyeonggi-do (KR)

( * ) Notice: Subject to any disclaimer, the term of this patent is extended or adjusted under 35 U.S.C. 154(b) by 131 days.

(21) Appl. No.: 11/505,420

(22) Filed: Aug. 17, 2006

(65) Prior Publication Data

US 2007/0155056 A1 Jul. 5, 2007

(30) Foreign Application Priority Data

Dec. 30, 2005 (KR) ........................ 10-2005-0135842

(51) Int. Cl.
*H01L 21/30* (2006.01)
(52) U.S. Cl. ............... 438/455; 438/406; 257/E21.122; 257/E21.48
(58) Field of Classification Search ................. 438/107, 438/113, 118, 455, 456, 458, 406
See application file for complete search history.

(56) References Cited

U.S. PATENT DOCUMENTS

| 4,975,390 | A | * | 12/1990 | Fujii et al. | 438/53 |
| 6,124,145 | A | * | 9/2000 | Stemme et al. | 438/26 |
| 6,433,367 | B1 | * | 8/2002 | Tohyama et al. | 257/88 |

* cited by examiner

*Primary Examiner*—Quoc D Hoang
(74) *Attorney, Agent, or Firm*—Stanzione & Kim, LLP (57) ABSTRACT

A silicon direct bonding (SDB) method by which void formation caused by gases is suppressed. The SDB method includes: preparing two silicon substrates having corresponding bonding surfaces; forming trenches having a predetermined depth in at least one bonding surface of the two silicon substrates; forming gas discharge outlets connected to the trenches on at least one of the two silicon substrates to vertically penetrate the bonding surface; cleaning the two silicon substrates; closely contacting the two silicon substrates to each other; and thermally treating the two substrates to bond them to each other. The trenches are formed along at least a part of a plurality of dicing lines, and both ends of the trenches are clogged. Gases generated during a thermal treatment process can be smoothly and easily discharged through the trenches and the gas discharge outlet such that a void is prevented from being formed in the junctions of the two silicon substrates due to the gases.

17 Claims, 6 Drawing Sheets

SILICON DIRECT BONDING METHOD

CROSS-REFERENCE TO RELATED APPLICATIONS

This application claims the benefit of Korean Patent Application No. 10-2005-0135842, filed on Dec. 30, 2005, in the Korean Intellectual Property Office, the disclosure of which is incorporated herein in its entirety by reference.

BACKGROUND OF THE INVENTION

1. Field of the Invention

The present general inventive concept relates to a silicon direct bonding (SDB) method, and more particularly, to a silicon direct bonding (SDB) method by which void formation caused by gases is suppressed.

2. Description of the Related Art

In general, a silicon substrate called a 'wafer' is used in the manufacture of various semiconductor devices. That is, various semiconductor devices are formed after micromachining like forming a predetermined material layer on such a silicon substrate or etching the surface of the silicon substrate.

In such a process of manufacturing a semiconductor device, two silicon substrates are bonded to each other. In this case, a silicon direct bonding (SDB) method has been generally used to bond two silicon substrates. Generally, the SDB method undergoes the following operations. Firstly, after two silicon substrates are prepared, the substrates are cleaned. Then, a thin film formed of ions and molecules such as $OH^-$, $H^+$, $H_2O$, $H_2$ and $O_2$ is formed on each of bonding surfaces of the two substrates. Subsequently, if the two substrates closely contact, the two substrates are pre-bonded with a force (Van der Waals's force) between the ions and the molecules. Next, if the two substrates in the close-contact state are put into a thermal treatment furnace and heated up to approximately 1000° C., the two substrates are strongly bonded with inter-diffusion between atoms of the two substrates.

However, gases are generated by the ions and the molecules that exist between the two substrates when the two substrates are thermally treated, and these gases may not be completely discharged during the thermal treatment, and therefore may remain between the two substrates. In this case, owing to the gases, a plurality of voids are formed in junctions of the two substrates. The voids cause a bond strength between two silicon substrates to be lowered and an inferiority rate of a semiconductor device formed on the substrates to be increased, such that a yield is lowered. This problem occurs even more often when the size of a substrate is increased and a bonding area is large.

SUMMARY OF THE INVENTION

The present general inventive concept provides a silicon direct bonding (SDB) method by which a trench is formed on bonding surfaces of two silicon substrates and a gas discharge outlet communicating with the trench is formed perpendicular to the bonding surfaces so that gases generated during a thermal treatment process can be easily and smoothly discharged and void formation caused by the gases is suppressed.

Additional aspects and advantages of the present general inventive concept will be set forth in part in the description which follows and, in part, will be obvious from the description, or may be learned by practice of the general inventive concept.

The foregoing and/or other aspects and utilities of the present general inventive concept are achieved by providing a silicon direct bonding method, the silicon direct bonding method including preparing two silicon substrates having corresponding bonding surfaces, forming at least one trench having a predetermined depth in at least one bonding surface of the two silicon substrates, forming at least one gas discharge outlet connected to the trench on at least one of the two silicon substrates to vertically penetrate the bonding surface, cleaning the two silicon substrates, closely contacting the two silicon substrates to each other, and thermally treating the two substrates to bond them to each other.

A silicon oxide film may be formed on at least one surface of the two silicon substrates, and the at least one trench may be formed in the silicon oxide film.

Both ends of the at least one trench may be clogged. In other words, the trenches do not extend to the outer periphery of the substrates.

The at least one trench may be formed along at least a part of a plurality of dicing lines and a plurality of gas discharge outlets may be formed along the trench.

The dicing lines may include first lines that extend to a first direction and second lines that extend to a second direction perpendicular to the first direction, a plurality of trenches may be formed along one of the first and second lines or all of them. A plurality of gas discharge outlets may be formed in each of the trenches. The gas discharge outlets may be formed in a position in which the first lines and the second lines cross one another.

The bonding surface may be etched to a predetermined depth so that the trenches can be formed therein.

Since gases generated during a thermal treatment process can be easily and smoothly discharged through the trench(s) and the gas discharge outlet, a void is prevented from being formed in the junctions of the two silicon substrates due to the gases.

The foregoing and/or other aspects and utilities of the present general inventive concept are also achieved by providing a silicon direct bonding method including forming at least one trench having a predetermined depth in at least one bonding surface of a pair of silicon substrates, forming at least one outlet connected to each trench and extending through the corresponding substrate, and thermally treating the two substrates to bond them to each other at the bonding surfaces.

The bonding surface in which the at least one trench is formed may be a silicon oxide film formed on the corresponding substrate.

The foregoing and/or other aspects and utilities of the present general inventive concept are also achieved by providing a silicon direct bonding method including forming grooves having a predetermined depth in at least one bonding surface of a pair of silicon substrates, forming at least one outlet connected to each groove and extending through the corresponding substrate and thermally treating the two substrates to bond them to each other at the bonding surfaces such that the grooves communicate outside of the bonded substrates through the at least one outlet

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Figure 1A:
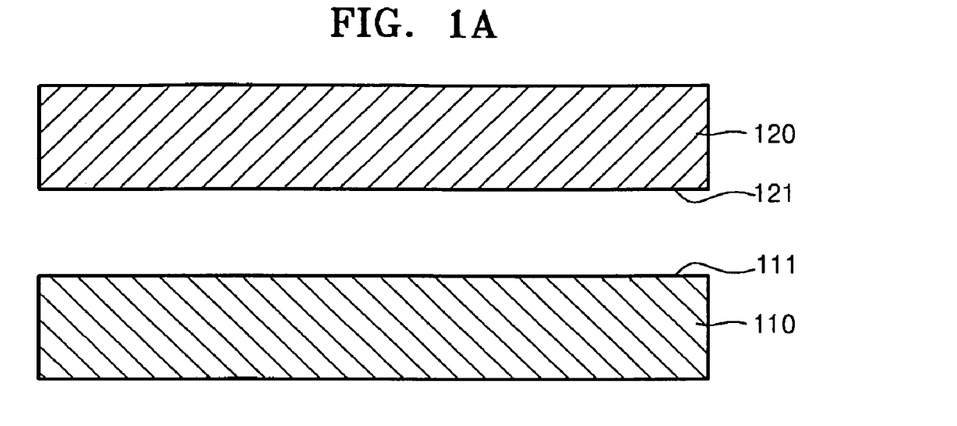
FIGS. 1A through 1H are cross-sectional views illustrating two silicon substrates and a silicon direct bonding (SDB) method according to an embodiment of the present general inventive concept.
Figure 1B:
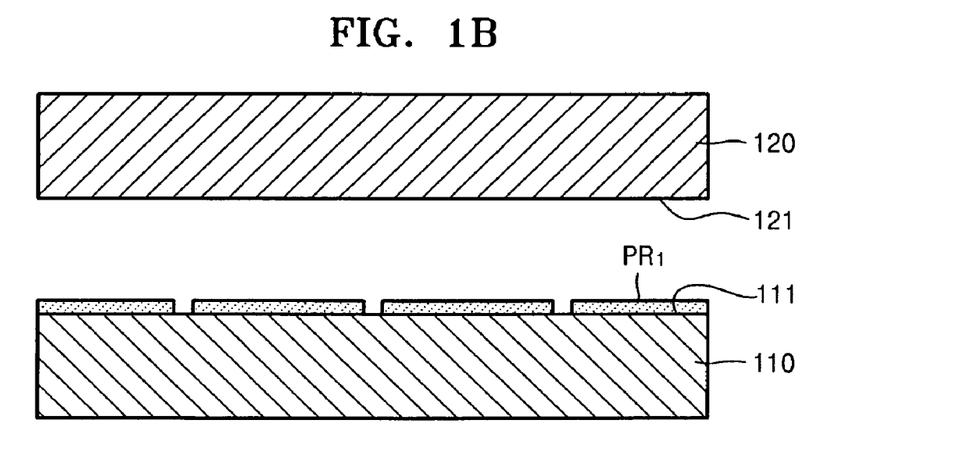
Figure 1C:
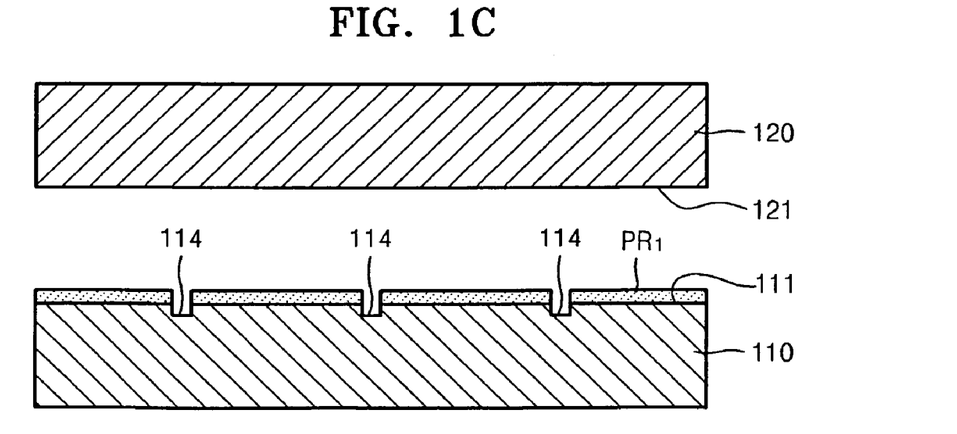
Figure 1D:
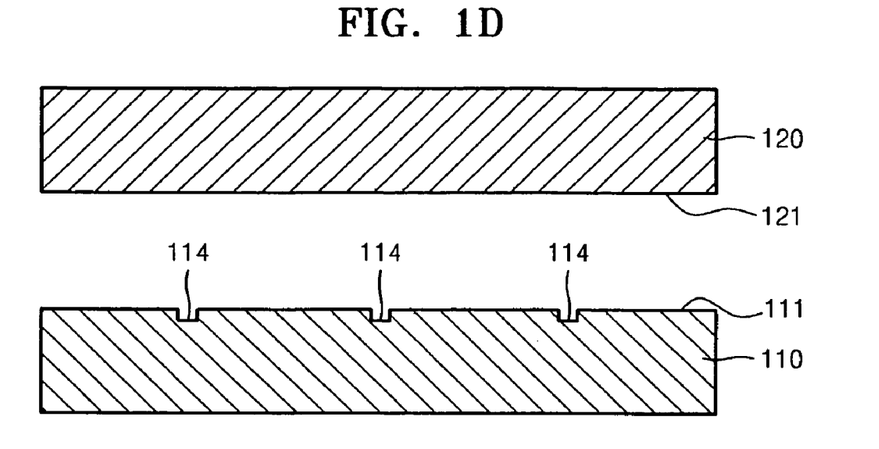
Figure 1E:
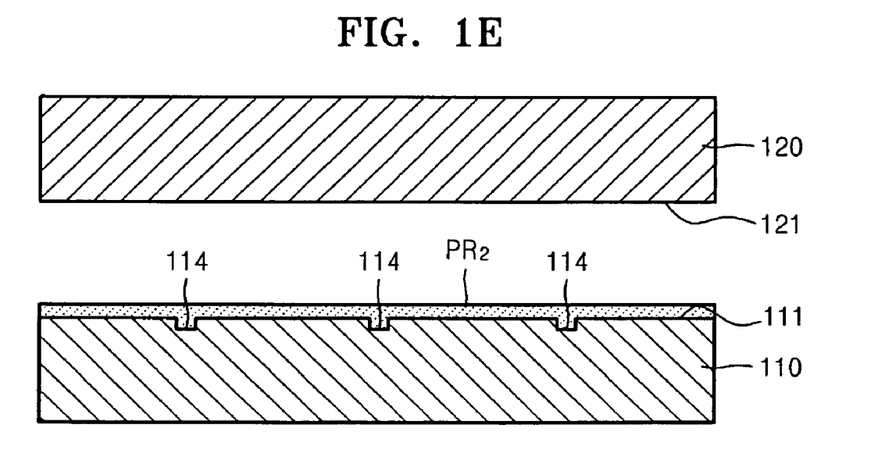
Figure 1F:
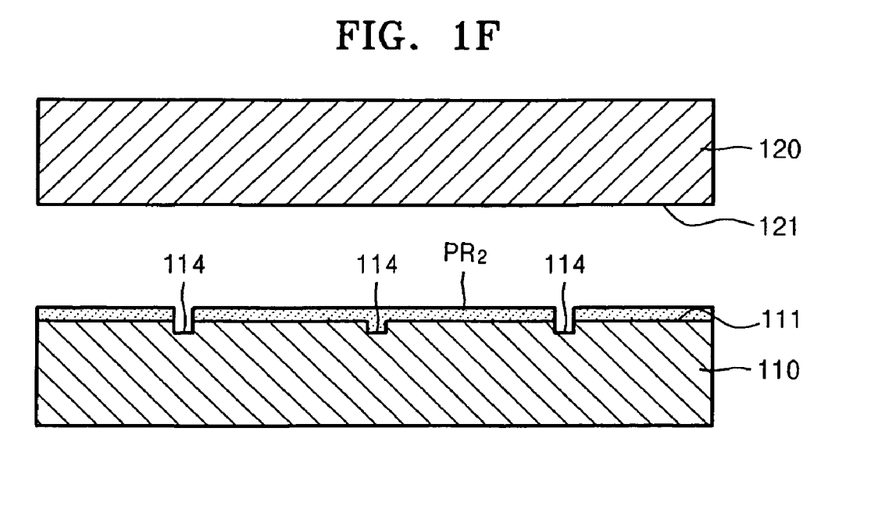
Figure 1G:
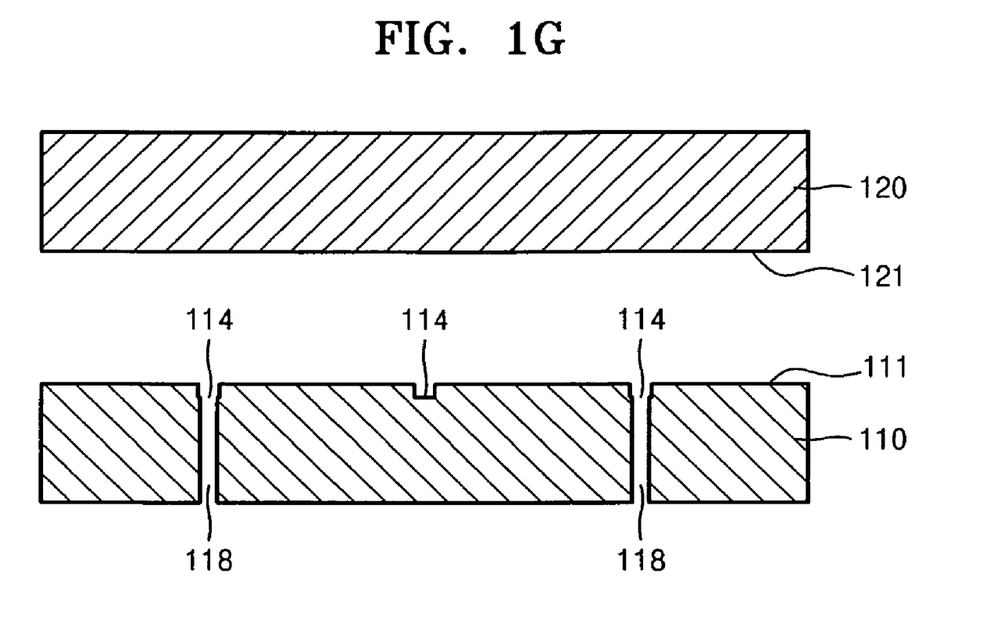
Figure 1H:
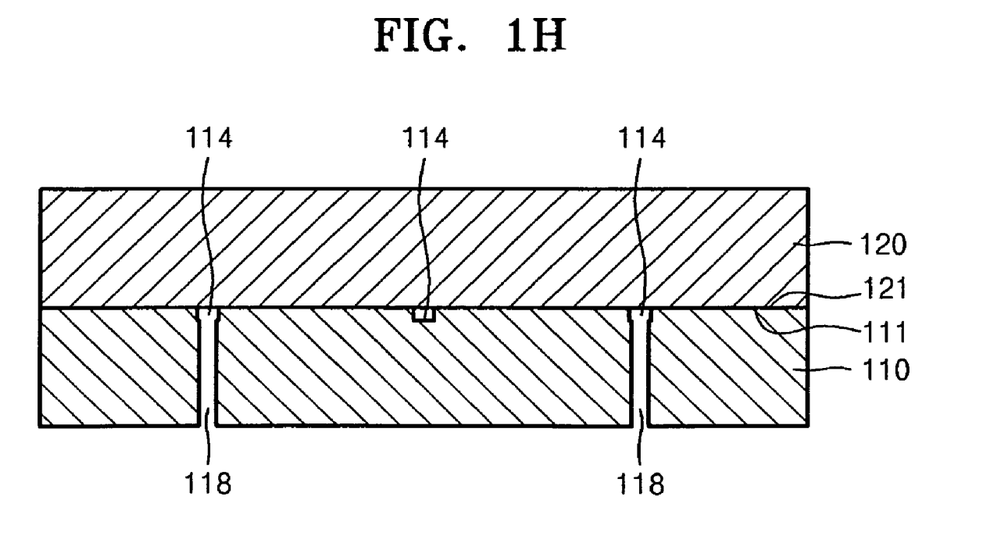
Figure 2:
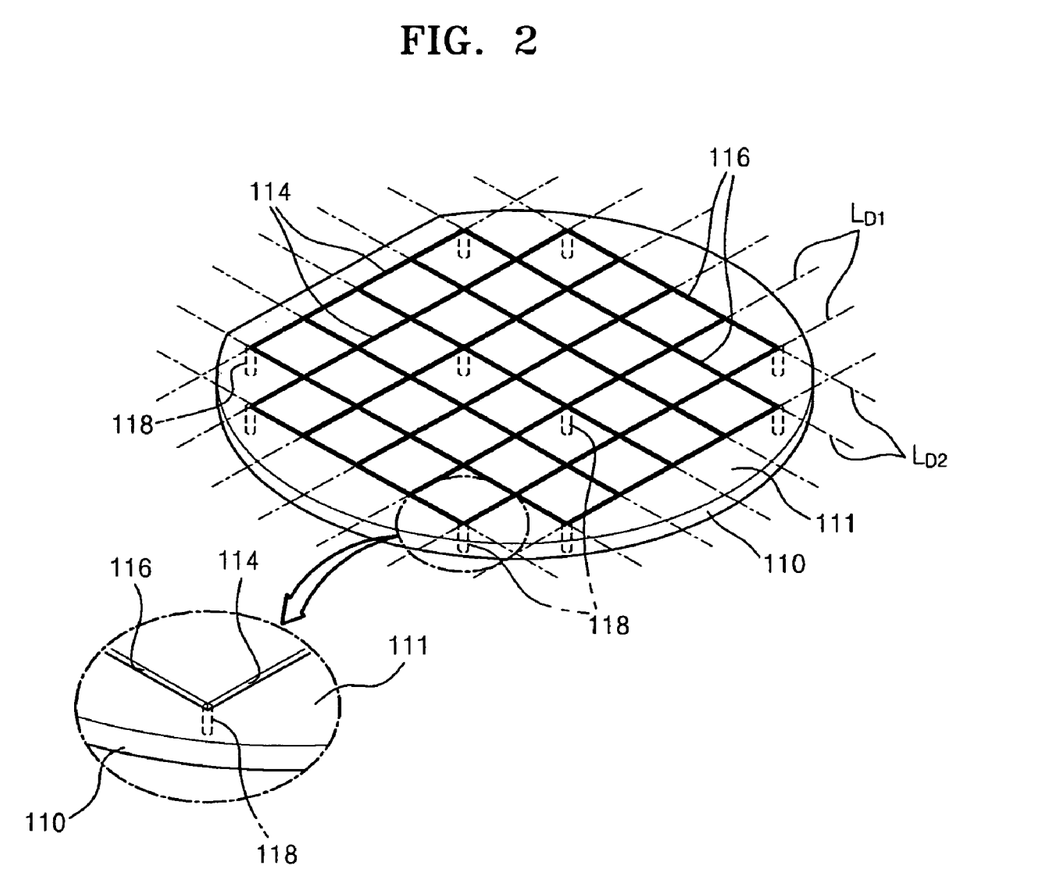
FIG. 2 is a perspective view illustrating a trench formed on a bonding surface of the silicon substrate and a gas discharge outlet formed to penetrate the silicon substrate in the operation illustrated in FIG. 1H.

FIGS. 1A through 1H are cross-sectional views illustrating two silicon substrates and a silicon direct bonding (SDB) method according to an embodiment of the present general inventive concept, and FIG. 2 is a perspective view illustrating a trench formed on a bonding surface of the silicon substrate and a gas discharge outlet formed to penetrate the silicon substrate in the operation illustrated in FIG. 1D.

Referring to FIG. 1A, the SDB method according to this embodiment is a method of bonding two silicon substrates 110 and 120 including the following operations.

Firstly, referring to FIG. 1A, two silicon substrates to be bonded to each other, that is, a first silicon substrate 110 and a second silicon substrate 120 are prepared. The first and second silicon substrates 110 and 120 can each be a silicon wafer widely used in the manufacturing of a semiconductor device. The first silicon substrate 110 has a first bonding surface 111 and the second silicon substrate 120 has a second bonding surface 121 corresponding to the first bonding surface 111.

Next, referring to FIG. 1B, a photoresist $PR_1$ is coated on one of the first and second silicon substrates 110 and 120, for example, on the first bonding surface 111 of the first silicon substrate 110. Subsequently, the photoresist $PR_1$ is patterned in a predetermined pattern through an exposure and development process. Then, a part of the first bonding surface 111 of the first silicon substrate 110 is exposed.

Next, referring to FIG. 1C, the first bonding surface 111 is etched to a predetermined depth by using the photoresist $PR_1$ as an etching mask, thereby forming one or more trenches 114. The etching of the first bonding surface 111 can be performed with a dry etching method, such as, for example, a reactive ion etching (RIE), or a wet etching method, such as, for example, submerging for a period of time in a solution such as acetone or the like. Subsequently, if the photoresist $PR_1$ is stripped, the trench 114 formed to the predetermined depth in the first bonding surface 111 of the first silicon substrate 110 remains, as illustrated in FIG. 1D.

Next, referring to FIG. 1E, a photoresist $PR_2$ is again coated on the first bonding surface 111 of the first silicon substrate 110. At this time, the photoresist $PR_2$ is formed to cover the entire pre-formed trench 114 (or trenches). Subsequently, the photoresist $PR_2$ is patterned in a pattern of a plurality of gas discharge outlets on the trench 114 through an exposure and development process. Then, a part of the trench 114 (or some of the trenches 114) formed on the first bonding surface 111 of the first silicon substrate 110 is exposed and the first silicon substrate 110 under the exposed trench 114 is also exposed, as illustrated in FIG. 1F.

Next, referring to FIG. 1G, if the first silicon substrate 110 that is exposed under the exposed trench 114 is etched to be vertically penetrated using the photoresist $PR_2$ as an etching mask, a gas discharge outlet 118 that vertically penetrates the bonding surface 111 is formed. At this time, etching of the first silicon substrate 110 can be made with a dry etching method such as the reactive ion etching (RIE) method or the wet etching method. Subsequently, if the photoresist $PR_2$ is stripped, the trench 114 (or trenches) formed to the predetermined depth on the first bonding surface 111 of the first silicon substrate 110 and the gas discharge outlet 118 connected to the trench 114 remain.

As described above, the gas discharge outlet 118 has been formed to penetrate the first silicon substrate 110. However, the gas discharge outlet 118 may also be formed to penetrate the second silicon substrate 120. More specifically, the trench 114 may be formed on the first silicon substrate 110 and the gas discharge outlet 118 may be formed in the second silicon substrate 120 to communicate with the corresponding trench 114.

In the above-described operations, the trenches 114 may be formed along a plurality of dicing lines $L_{D1}$ and $L_{D2}$ illustrated in FIG. 2, in order not to affect the semiconductor device formed on the silicon substrates 110 and 120. Here, dicing indicates that, after a plurality of semiconductor devices are formed on the two silicon substrates 110 and 120, the silicon substrates 110 and 120 are cut so that each of the semiconductor devices can be separated from one another. Generally, the dicing lines $L_{D1}$ and $L_{D2}$ include first lines $L_{D1}$ that extend to a first direction and second lines $L_{D2}$ that extend to a second direction perpendicular to the first direction. A plurality of trenches 114 may be formed along one of the first lines $L_{D1}$ and the second lines $L_{D2}$, for example, along the first lines $L_{D1}$, as illustrated in FIG. 2. A plurality of trenches 116 may alternatively or also be formed on the second lines $L_{D2}$. The trenches 116 formed along the second lines $L_{D2}$ may also be formed simultaneously with the trench 114 through the operations illustrated in FIGS. 1A through 1G.

The trenches 114 and 116 do not extend to the outer circumference of the two silicon substrates 110 and 120. In other words, both ends of the trenches 114 and 116 are clogged. The clogging of the trenches is performed since when the trenches 114 and 116 extend to the outer circumference of the two silicon substrates 110 and 120, the possibility that cracks occur on the substrates 110 and 120 may be increased.

A plurality of gas discharge outlets 118 may be formed on each of the trenches 114 and 116. For example, the gas discharge outlets 118 may be formed in a position in which the first lines $L_{D1}$ and the second lines $L_{D2}$ cross one another.

The gas discharge outlets 118 may be formed simultaneously with a process of forming a through hole when a micro-electro-mechanical system (MEMS) is manufactured. For example, if a process of forming a flow-path through hole is used when an MEMS head for a liquid crystal display (LCD) is manufactured, the gas discharge outlets 118 may also be formed without performing additional processes.

The trenches 114 and 116 formed in this way communicate with the outside of the silicon substrates 110 and 120 through the gas discharge outlets 118. Thus, gases generated between the silicon substrates 110 and 120 can be discharged to the outside of the silicon substrates 110 and 120, which will be described later.

Next, the first silicon substrate 110 and the second silicon substrate 120 are cleaned. The cleaning operation can include a cleaning process and a drying process. Then, a thin film (not illustrated) formed of ions and molecules such as $OH^-$, $H^+$, $H_2O$, $H_2$ and $O_2$ is formed on the first bonding surface 111 of the first silicon substrate 110 and the second bonding surface 121 of the second silicon substrate 120.

Referring to FIG. 1H, if the first silicon substrate 110 and the second silicon substrate 120 closely contact each other, the two silicon substrates 110 and 120 are pre-bonded with a force (Van der Waals's force) between the above-described ions and the molecules. Subsequently, the two silicon substrates 110 and 120 in the close-contact state are put into a thermal treatment furnace and thermally heated to approximately 1000° C. The two silicon substrates 110 and 120 are then strongly bonded with an inter-diffusion between atoms of the two silicon substrates 110 and 120.

At this time, in the thermal treatment operation, gases are generated by the ions and the molecules that exist between the two silicon substrates 110 and 120. However, the gases can flow into the adjacent trenches 114 and 116 and can be smoothly and easily discharged through the gas discharge outlets 118 that communicate with the trenches 114 and 116 to the outside of the silicon substrates 110 and 120.

As described above, in the SDB method according to the present embodiment, the gases generated during the thermal treatment process can be smoothly and easily discharged through the trenches 114 and 116 and the gas discharge outlets 118 so that a void is prevented from being formed in the junctions of the two silicon substrates 110 and 120, or void formation can be minimized.

FIGS. 3A through 3D are cross-sectional views illustrating two silicon substrates and an SDB method according to another embodiment of the present general inventive concept.

Figure 3A:
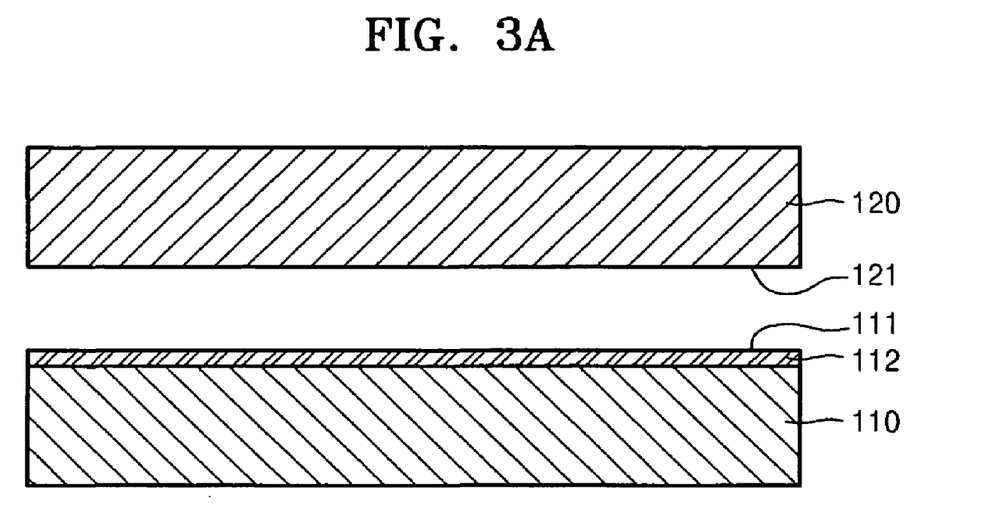
FIGS. 3A through 3D are cross-sectional views illustrating two silicon substrates and an SDB method according to another embodiment of the present general inventive concept.

Referring to FIG. 3A, in the SDB method, a silicon oxide film 112 can be formed on one of two silicon substrates 110 and 120, for example, on the surface of the first silicon substrate 110. In this case, the surface of the silicon oxide film 112 is a first bonding surface 111'. The silicon oxide film 112 can also be formed on a surface 121 corresponding to the second silicon substrate 120. In this way, if the silicon oxide film 112 is formed on one of the two silicon substrates 110 and 120 or both of them, it is known that a bond strength between the two silicon substrates 110 and 120 is enhanced.

Figure 3B:
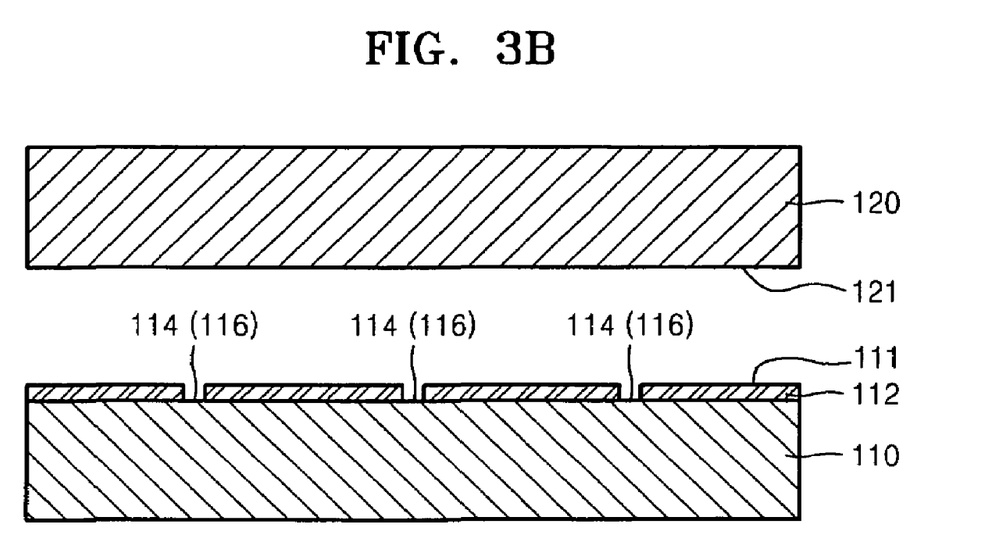

Next, referring to FIG. 3B, the silicon oxide film 112 formed on the first silicon substrate 110 is etched to a predetermined depth, thereby forming a trench 114. At this time, the trench 116 (or trenches 116) illustrated in FIG. 2 can be formed in the silicon oxide film 112 along with the trench 114 (or trenches 114). The formation of the trenches 114 and 116 can be made with the same method as the method illustrated in FIGS. 1B and 1C. At this time, the trenches 114 and 116 may be formed to penetrate the entire thickness of the silicon oxide film 112, as illustrated in FIG. 3B, or may be formed in only a part of the entire thickness of the silicon oxide film 112.

Figure 3C:
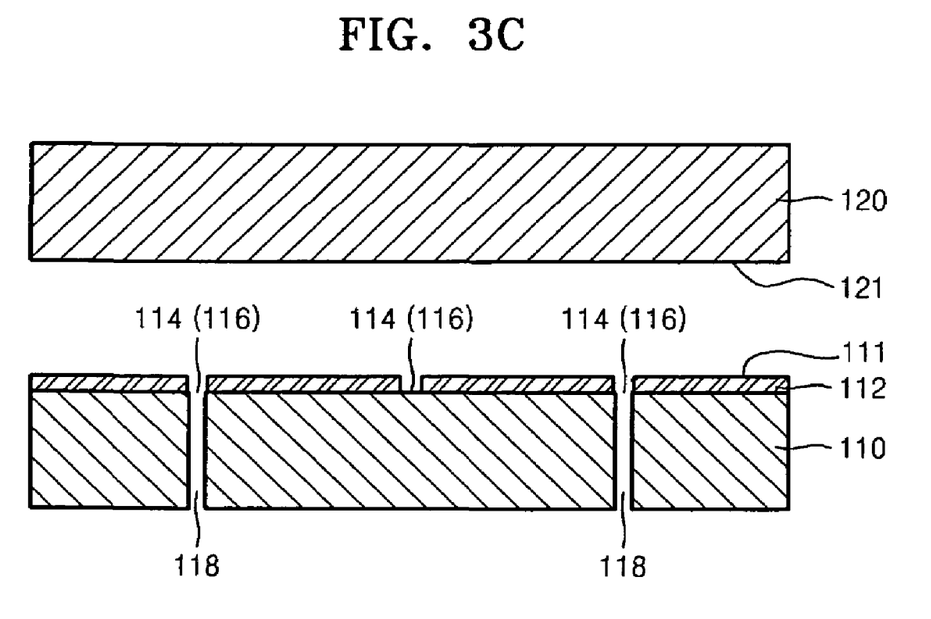

Next, referring to FIG. 3C, the first silicon substrate 110 under the trenches 114 and 116 is etched to be vertically penetrated, thereby forming gas discharge outlets 118 that vertically penetrate the bonding surface 111'. The formation of the gas discharge outlets 118 can be made with the same method as the method illustrated in FIGS. 1E through 1G. As described above, the gas discharge outlets 118 may be formed to penetrate the second silicon substrate 120.

In the above-described operations, the trenches 114 and 116 may be formed along a plurality of dicing lines $L_{D1}$ and $L_{D2}$ illustrated in FIG. 2, in order not to affect the semiconductor device formed on the silicon substrates 110 and 120. Specifically, a plurality of trenches 114 may be formed along first lines $L_{D1}$ that extend to a first direction, and a plurality of trenches 116 may be formed along second lines $L_{D2}$ that extend to a second direction perpendicular to the first direction. The trenches 114 and 116 may be formed in various shapes in which gases can be smoothly and easily discharged according to a bonded area of the silicon substrates 110 and 120.

The trenches 114 and 116 do not extend to the outer circumference of the two silicon substrates 110 and 120. In other words, both ends of the trenches 114 and 116 are clogged. A plurality of gas discharge outlets 118 may be formed on each of the trenches 114 and 116. For example, the gas discharge outlets 118 may be formed in a position in which the first lines $L_{D1}$ and the second lines $L_{D2}$ cross one another.

Figure 3D:
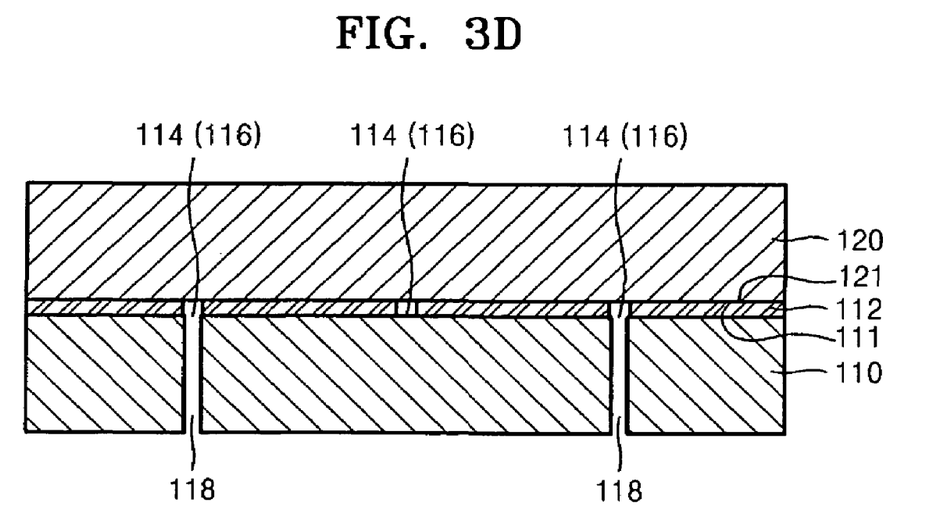

Next, the first silicon substrate 110 and the second silicon substrate 120 are cleaned. Then, as illustrated in FIG. 3D, the first silicon substrate 110 and the second silicon substrate 120 closely contact each other. Subsequently, the two silicon substrates 110 and 120 in the close-contact state are put into a thermal treatment furnace and thermally heated to approximately 1000° C. The two silicon substrates 110 and 120 are then strongly bonded with inter-diffusion between atoms of the two silicon substrates 110 and 120.

At this time, like in FIGS. 1A through 1H, gases are generated by the ions and the molecules that exist between the two silicon substrates 110 and 120. However, the gases can flow into the adjacent trenches 114 and 116 and can be smoothly and easily discharged through the gas discharge outlets 118 that communicate with the trenches 114 and 116 to the outside of the silicon substrates 110 and 120.

As described above, in the SDB methods according to the various embodiments of the present general inventive concept, since the trench is formed on the bonding surfaces of the two silicon substrates and gases generated during the thermal treatment process can be smoothly and easily discharged through the trenches formed on the boding surface of the two silicon substrates as well as the gas discharge outlets that communicate with the trenches, a void is prevented from being formed in the junctions of the two silicon substrates due to the gases. Thus, the bond strength of the two silicon substrates is enhanced and the inferiority rate of the semiconductor device formed on the substrates is lowered such that a yield is improved.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A silicon direct bonding method comprising:
   preparing two silicon substrates having corresponding bonding surfaces;
   forming one or more trenches having a predetermined depth in at least one bonding surface of the two silicon substrates;
   forming a gas discharge outlet connected to the one or more trenches on at least one of the two silicon substrates to vertically penetrate the bonding surface;
   cleaning the two silicon substrates;
   closely contacting the two silicon substrates to each other;
   thermally treating the two substrates to bond them to each other; and
   discharging gases generated by the thermal treating through the gas discharge outlet.

2. The silicon direct bonding method of claim 1, wherein a silicon oxide film is formed on at least one surface of the two silicon substrates, and the one or more trenches are formed in the silicon oxide film.

3. The silicon direct bonding method of claim 1, wherein both ends of the one or more trenches are clogged such that they do not extend to edges of the substrate.

4. The silicon direct bonding method of claim 1, wherein the one or more trenches are formed along at least a part of a plurality of dicing lines and a plurality of gas discharge outlets are formed along the one or more trenches.

5. The silicon direct bonding method of claim 4, wherein the dicing lines include first lines that extend to a first direction and second lines that extend to a second direction perpendicular to the first direction, and a plurality of trenches are formed along one of the first and second lines and a plurality of gas discharge outlets are formed in each of the trenches.

6. The silicon direct bonding method of claim 4, wherein the dicing lines include first lines that extend to a first direction and second lines that extend to a second direction perpendicular to the first direction, a plurality of trenches are formed along all of the first and second lines and a plurality of gas discharge outlets are formed in each of the trenches.

7. The silicon direct bonding method of claim 6, wherein the gas discharge outlets are formed in a position in which the first lines and the second lines cross one another.

8. The silicon direct bonding method of claim 1, wherein the bonding surface is etched to a predetermined depth so that the trench can be formed therein.

9. The silicon direct bonding method of claim 1, wherein the gas discharge outlets are formed simultaneously with a process of forming a through hole when a micro-electro-mechanical system (MEMS) is manufactured.

10. A silicon direct bonding method comprising:
forming at least one trench having a predetermined depth in at least one bonding surface of a pair of silicon substrates;
forming at least one outlet connected to each trench and extending through the corresponding substrate;
thermally treating the two substrates to bond them to each other at the bonding surfaces; and
discharging gases generated by the thermal treating through the at least one outlet.

11. The method of claim 10, wherein the bonding surface in which the at least one trench is formed is a silicon oxide film formed on the corresponding substrate.

12. The method of claim 10, wherein the at least one trench is formed along at least one dicing line extending across a surface of the corresponding substrate.

13. The method of claim 12, wherein the at least one dicing line comprises a plurality of dicing lines disposed in a perpendicular formation to form a plurality of grids, and the at least one trench comprises a plurality of trenches each formed along the plurality of dicing lines.

14. The method of claim 13, wherein the trenches do not extend to outer circumferences of the substrate.

15. A silicon direct bonding method comprising:
forming grooves having a predetermined depth in at least one bonding surface of a pair of silicon substrates;
forming at least one outlet connected to each groove and extending through the corresponding substrate;
thermally treating the two substrates to bond them to each other at the bonding surfaces such that the grooves communicate outside of the bonded substrates through the at least one outlet; and
discharging gases generated by the thermal treating through the at least one outlet.

16. The method of claim 15, wherein at least one groove of the formed grooves is formed along at least one dicing line extending across a surface of the corresponding substrate.

17. The method of claim 16, wherein the at least one dicing line comprises a plurality of dicing lines disposed in a perpendicular formation to form a plurality of grids, and the at least one groove comprises a plurality of grooves each formed along the plurality of dicing lines.

* * * * *